(12) United States Patent
Hsieh et al.

(10) Patent No.: US 11,929,431 B2
(45) Date of Patent: Mar. 12, 2024

(54) HEMT AND METHOD OF FABRICATING THE SAME

(71) Applicant: UNITED MICROELECTRONICS CORP., Hsin-Chu (TW)

(72) Inventors: Po-Kuang Hsieh, Kaohsiung (TW); Shih-Hung Tsai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/138,145

(22) Filed: Apr. 24, 2023

(65) Prior Publication Data

US 2023/0261102 A1 Aug. 17, 2023

Related U.S. Application Data

(63) Continuation of application No. 17/544,867, filed on Dec. 7, 2021, now Pat. No. 11,670,710, which is a continuation of application No. 16/578,407, filed on Sep. 23, 2019, now Pat. No. 11,227,944.

(30) Foreign Application Priority Data

Aug. 14, 2019 (CN) .......................... 201910747978.7

(51) Int. Cl.
*H01L 29/778* (2006.01)
*H01L 29/66* (2006.01)

(52) U.S. Cl.
CPC .... *H01L 29/7787* (2013.01); *H01L 29/66462* (2013.01)

(58) Field of Classification Search
CPC ........... H01L 29/7787; H01L 29/66462; H01L 29/7786; H01L 29/41766
See application file for complete search history.

(56) References Cited

U.S. PATENT DOCUMENTS

| 7,932,539 B2 | 4/2011 | Chen |
| 2011/0261853 A1 | 10/2011 | Kajitani |
| 2013/0248874 A1 | 9/2013 | Kuraguchi |
| 2013/0248928 A1 | 9/2013 | Yoshioka |

(Continued)

FOREIGN PATENT DOCUMENTS

| CN | 102569377 A | 7/2012 |
| CN | 103151370 A | 6/2013 |

(Continued)

*Primary Examiner* — Peter M Albrecht
(74) *Attorney, Agent, or Firm* — Winston Hsu (57) ABSTRACT

A high electron mobility transistor includes a first III-V compound layer. A second III-V compound layer is disposed on the first III-V compound layer. The composition of the first III-V compound layer and the second III-V compound layer are different from each other. A shallow recess, a first deep recess and a second deep recess are disposed in the second III-V compound layer. The first deep recess and the second deep recess are respectively disposed at two sides of the shallow recess. The source electrode fills in the first deep recess and contacts the top surface of the first III-V compound layer. A drain electrode fills in the second deep recess and contacts the top surface of the first III-V compound layer. The shape of the source electrode and the shape of the drain electrode are different from each other. A gate electrode is disposed on the shallow recess.

9 Claims, 5 Drawing Sheets (56) References Cited

U.S. PATENT DOCUMENTS

| | | |
|---|---|---|
| 2013/0313561 A1 | 11/2013 | Suh |
| 2013/0320349 A1 | 12/2013 | Saunier |
| 2016/0133739 A1* | 5/2016 | Kanaga .............. H01L 29/7787 |
| | | 257/194 |
| 2016/0276473 A1 | 9/2016 | Edwards |
| 2017/0263700 A1 | 9/2017 | Stoffels |

FOREIGN PATENT DOCUMENTS

| | | |
|---|---|---|
| CN | 103367356 A | 10/2013 |
| JP | 2008141040 | 6/2008 |
| KR | 10-2015-0030283 A | 3/2015 |

* cited by examiner

HEMT AND METHOD OF FABRICATING THE SAME

CROSS REFERENCE TO RELATED APPLICATIONS

This application is a continuation application of U.S. application Ser. No. 17/544,867, filed on Dec. 7, 2021, which is a continuation application of U.S. application Ser. No. 16/578,407, filed on Sep. 23, 2019. The contents of these applications are incorporated herein by reference.

BACKGROUND OF THE INVENTION

1. Field of the Invention

The present invention relates to a method of fabricating a high electron mobility transistor (HEMT) and an HEMT, and more particularly, to a method of fabricating an HEMT with a source electrode and a drain electrode in different shapes.

2. Description of the Prior Art

Due to their semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different bandgaps are combined and a heterojunction is formed at the junction between the semiconductor materials as a channel for carriers. In recent years, gallium nitride (GaN) based materials have been applied in high power and high frequency products because of their properties of wider bandgap and high saturation velocity.

A two-dimensional electron gas (2DEG) may be generated by the piezoelectric property of the GaN-based materials, and the switching velocity may be enhanced because of the higher electron velocity and the higher electron density of the 2DEG.

As the semiconductor devices are upgraded, the efficiency of the HEMTs needs to be improved.

SUMMARY OF THE INVENTION

In light of the above, the present invention provides an HEMT with increased efficiency by lowering the on-resistance.

According to a preferred embodiment of the present invention, a high electron mobility transistor (HEMT) includes a first III-V compound layer. A second III-V compound layer is disposed on the first III-V compound layer, wherein the composition of the first III-V compound layer and the second III-V compound layer are different from each other. A shallow recess, a first deep recess and a second deep recess are disposed in the second III-V compound layer, wherein the first deep recess and the second deep recess are respectively disposed at two sides of the shallow recess. A source electrode fills in the first deep recess and contacts a top surface of the first III-V compound layer. A drain electrode fills in the second deep recess and contacts the top surface of the first III-V compound layer, wherein a shape of the source electrode and a shape of the drain electrode are different from each other. A gate electrode is disposed on the shallow recess.

According to a preferred embodiment of the present invention, a fabricating method of a high electron mobility transistor (HEMT) includes providing a first III-V compound layer. Next, a second III-V compound layer is formed on the first III-V compound layer, wherein the composition of the first III-V compound layer and the second III-V compound layer are different from each other. A shallow recess, a first deep recess and a second deep recess are formed to dispose in the second III-V compound layer, wherein the first deep recess and the second deep recess are respectively disposed at two sides of the shallow recess. A source body layer and a drain electrode are formed, wherein the source body layer is in the first deep recess, and the drain electrode is in the second deep recess. Later, a conductive layer is formed to cover the source body layer, the shallow recess, the second III-V compound layer and the drain electrode. Next, the conductive layer covering the shallow recess, covering the drain electrode and covering the second III-V compound layer between shallow recess and the drain electrode is removed, the conductive layer covering the source body layer, and between the shallow recess and the source body layer are remained to serve as a source extension layer, wherein the source body layer and the source extension layer form a source electrode. Finally, a gate electrode is formed on the shallow recess.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 depict a fabricating method of a high electron mobility transistor (HEMT) according to a first preferred embodiment of the present invention, wherein:

DETAILED DESCRIPTION

FIG. 1 to FIG. 7 depict a fabricating method of a high electron mobility transistor (HEMT) according to a first preferred embodiment of the present invention.

Figure 1:
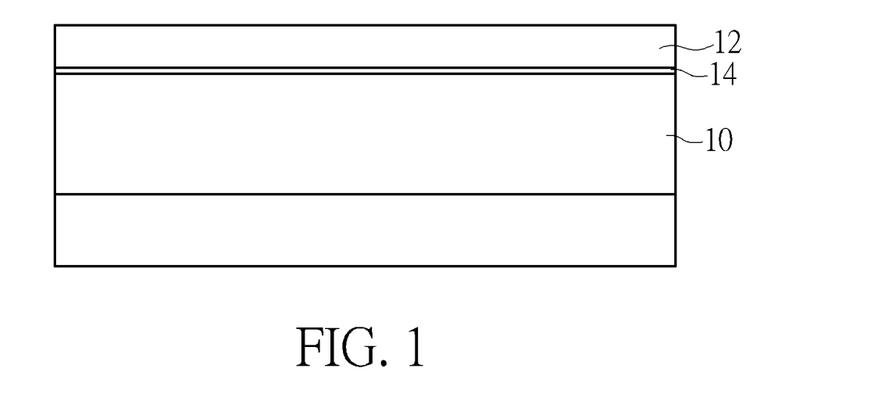
FIG. 1 depicts a substrate covered by a first III-V compound layer and a second III-V compound layer.

As shown in FIG. 1, a substrate is provided. A first III-V compound layer 10 is formed on the substrate. Later, a second III-V compound layer 12 is formed to cover and contact the first III-V compound layer 10. The composition of the first III-V compound layer 10 and the second III-V compound layer 12 are different from each other. The first III-V compound layer 10 may be gallium nitride (GaN), indium gallium nitride ($In_xGa_{1-x}N$), aluminum gallium nitride ($Al_xGa_{1-x}N$), aluminum indium nitride ($Al_xIn_{1-x}N$), aluminum indium gallium nitride ($Al_{1-x-y}In_xGa_yN$) or aluminum nitride (AlN). The second III-V compound layer 12 may be aluminum gallium nitride ($Al_xGa_{1-x}N$), aluminum indium nitride ($Al_xIn_{1-x}N$), aluminum indium gallium nitride ($Al_{1-x-y}In_xGa_yN$) and/or aluminum nitride (AlN). According to a preferred embodiment of the present invention, the first III-V compound layer 10 is gallium nitride, and the second III-V compound layer 12 is aluminum gallium nitride. After the second III-V compound layer 12 contacts the first III-V compound layer 10, a two-dimensional electron gas (2DEG) 14 is generated in the interface of the first III-V compound layer 10 and the second III-V compound layer 12.

Figure 2:
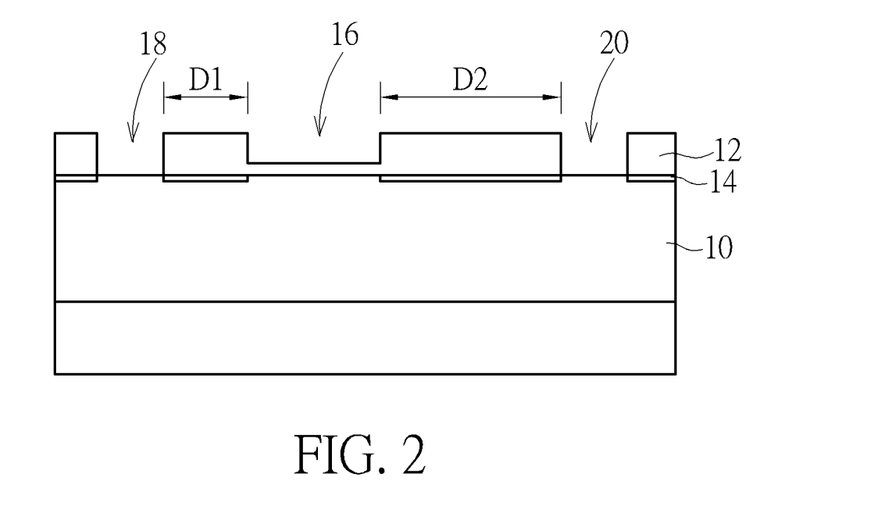
FIG. 2 depicts a stage following FIG. 1.

As shown in FIG. 2, a shallow recess 16 is formed in the second III-V compound layer 12. Then, a first deep recess 18 and a second deep recess 20 are respectively formed in the second III-V compound layer 12 at two sides of the shallow recess 16. The shallow recess 16, the first deep recess 18, the second deep recess 20 can be formed by a lithography process and an etching process. The shallow recess 16 does not penetrate the second III-V compound layer 12. The first deep recess 18 and the second deep recess 20 both penetrate the second III-V compound layer 12. That is, the depth of the shallow recess 16 is smaller than the depths of the first deep recess 18 and the second deep recess 20. After forming the first deep recess 18 and the second deep recess 20, the second III-V compound layer 12 is exposed through the first deep recess 18 and the second deep recess 20. After forming the shallow recess 16, the first deep recess 18 and the second deep recess 20, the 2DEG 14 directly below the shallow recess 16, the first deep recess 18 and the second deep recess 20 is depleted. According to a preferred embodiment of the present invention, a distance D1 between the first deep recess 18 and the shallow recess 16 is smaller than a distance D2 between the second deep recess 20 and the shallow recess 16.

Figure 3:
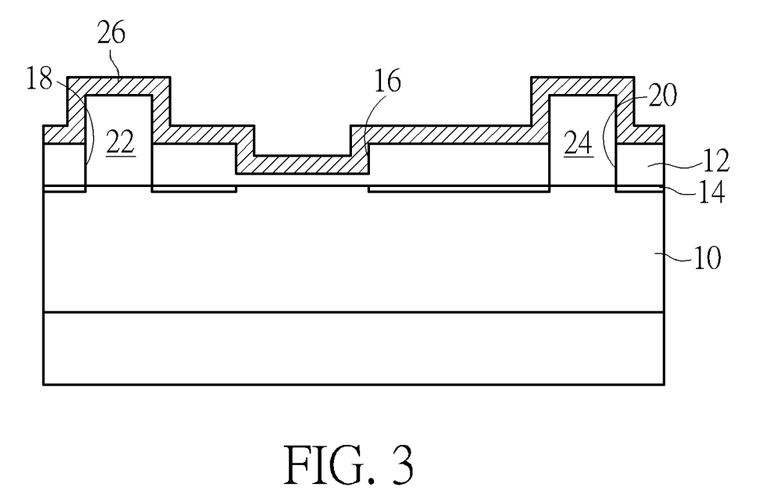
FIG. 3 depicts a stage following FIG. 2.

As shown in FIG. 3, a source body layer 22 and a drain electrode 24 are formed. The source body layer 22 is in the first deep recess 18. The drain electrode 24 is in the second deep recess 20. The step of forming the source body layer 22 and the drain electrode 24 include forming a mask layer (not shown) covering the second III-V compound layer 12. Later, positions of the drain electrode 24 and the source body layer 22 are defined in the mask layer and the first deep recess 18 and the second deep recess 20 are exposed. Next, metal materials are sputtered into the first deep recess 18 and the second deep recess 20 to serve as the drain electrode 24 and the source body layer 22. The source body layer 22 and the drain electrode 24 may respectively include titanium, aluminum, nickel or other conductive materials. After forming the source body layer 22 and the drain electrode 24, a conductive layer 26 is formed conformally to cover the source body layer 22, the shallow recess 16, the second III-V compound layer 12 and the drain electrode 24. The conductive layer 26 includes titanium nitride, gold, platinum, titanium, indium tin oxide (ITO) or aluminum-doped zinc oxide (AZO) or other conductive materials.

Figure 4:
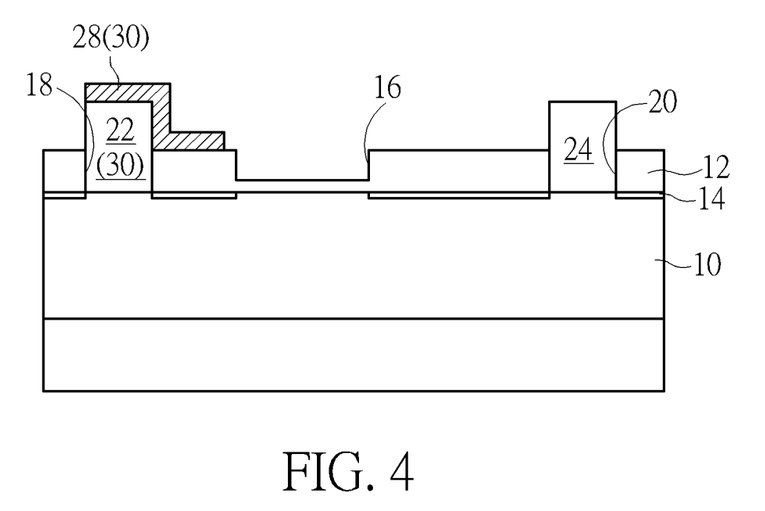
FIG. 4 depicts a stage following FIG. 3.

As shown in FIG. 4, the conductive layer 26 covering the shallow recess 16, the drain electrode 24 and the second III-V compound layer 12 between the shallow recess 16 and the drain electrode 24 is removed. The conductive layer 26 covering the top surface of the source body layer 22, a sidewall of the source body layer 22, the second III-V compound layer 12 between the shallow recess 16 and the source body layer 22 is remained to serve as a source extension layer 28. The source body layer 22 and the source extension layer 28 form a source electrode 30. It is noteworthy that a shape of the source electrode 30 and a shape of the drain electrode 24 are different from each other. According to a preferred embodiment of the present invention, the material of the source body layer 22 and the material of the source extension layer 28 are different. According to yet another preferred embodiment of the present invention, the material of the source body layer 22 and the material of the source extension layer 28 are the same.

Figure 8:
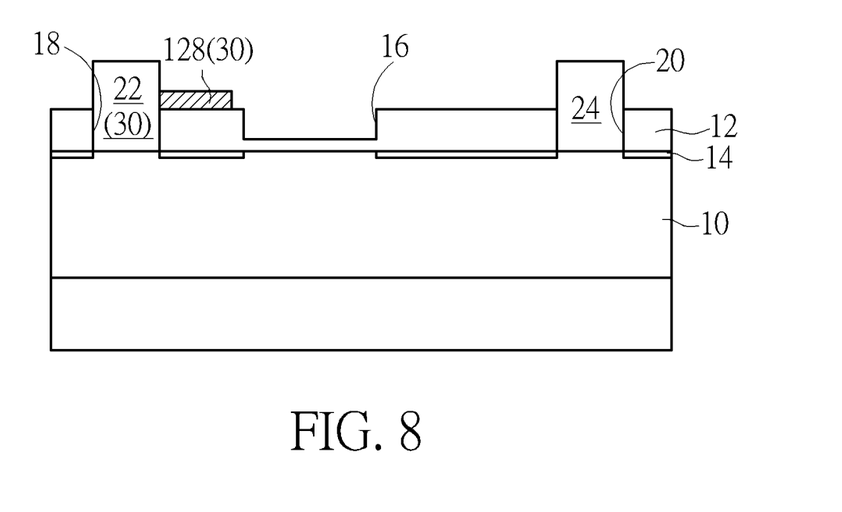
FIG. 8 depicts a fabricating method of an HEMT according to a second preferred embodiment of the present invention.

FIG. 8 depicts a fabricating method of an HEMT according to a second preferred embodiment of the present invention, wherein elements which are substantially the same as those in the first preferred embodiment are denoted by the same reference numerals; an accompanying explanation is therefore omitted. According to the second preferred embodiment of the present invention, as shown in FIG. 8, during the step of removing the conductive layer 26, the conductive layer 26 can only be remained between the shallow recess 16 and the source body layer 22 to serve as a source extension layer 128. In detail, the remaining conductive layer 26 is only on the second III-V compound layer 12 between the source body layer 22 and shallow recess 16.

According to another preferred embodiment of the present invention, the source extension layer 28 and the source body layer 22 can be a monolithic structure. That is, when defining position of the source body layer 22 on the mask layer, the position of the source extension layer 28 can be defined as well. Then, the source extension layer 28 can be formed together with the source body layer 22 by sputtering metal materials. In this embodiment, the conductive layer 26 can be omitted. In the following fabricating processes, the source extension layer 28 in FIG. 4 will be taken as an example.

Figure 5:
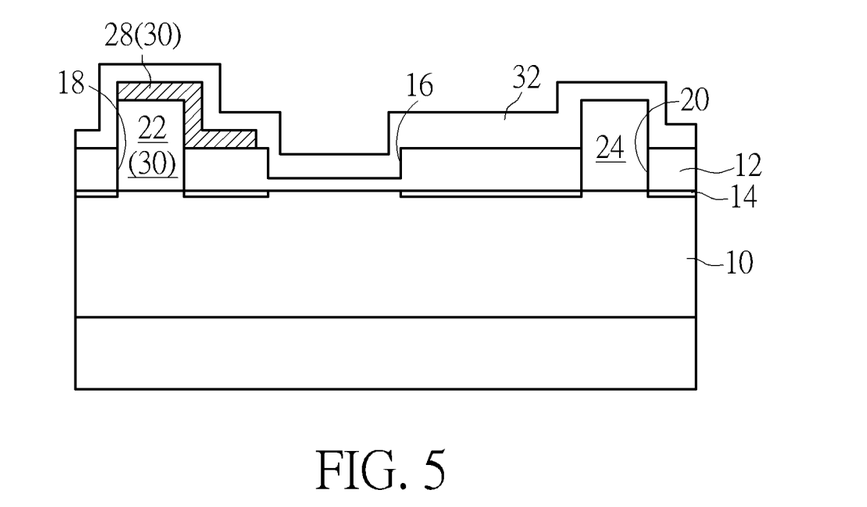
FIG. 5 depicts a stage following FIG. 4.
Figure 6:
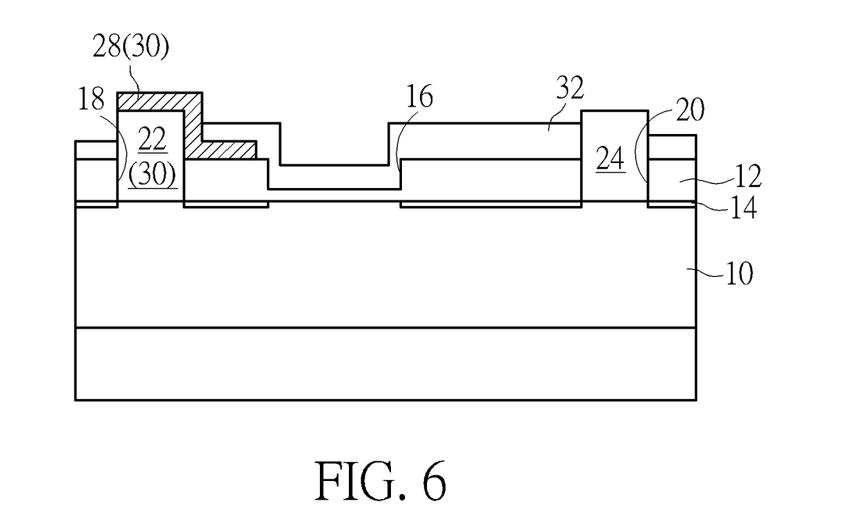
FIG. 6 depicts a stage following FIG. 5.
Figure 7:
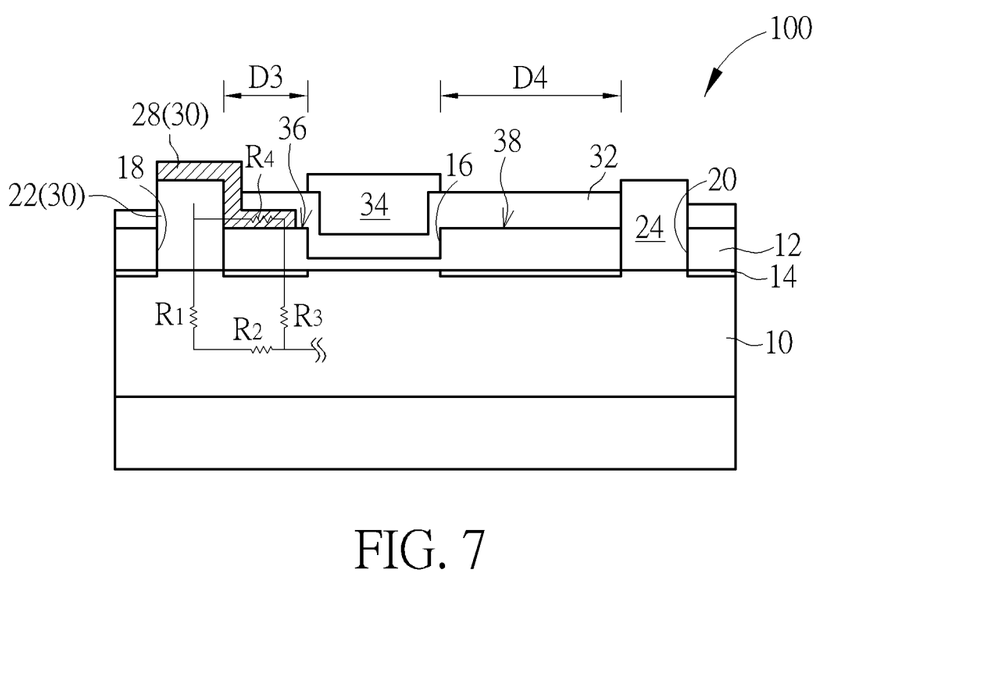
FIG. 7 depicts a stage following FIG. 6.

As shown in FIG. 5, a protective layer 32 is optionally formed to conformally cover and contact the second III-V compound layer 12, the source extension layer 28, the drain electrode 24 and fill in the shallow recess 16. The protective layer 32 can be silicon nitride or aluminum nitride, or other suitable materials. As shown in FIG. 6, part of the protective layer 32 is removed, only the protective layer 32 between the first deep recess 18 and the second deep recess 20 is remained. That is, the remaining protective layer 32 only contacts part of the source extension layer 28, fills in the shallow recess 16 and contacts the second III-V compound layer 12 between the shallow recess 16 and the second deep recess 20. As shown in FIG. 7, a gate electrode 34 is formed on the shallow recess 16. Now an HEMT 100 of the present invention is completed. The HEMT 100 is a normally-off transistor.

FIG. 7 depicts an HEMT according to a preferred embodiment of the present invention. As shown in FIG. 7, an HEMT 100 includes a first III-V compound layer 10. A second III-V compound layer 12 is disposed on the first III-V compound layer 10. The composition of the first III-V compound layer 10 and the second III-V compound layer 12 are different from each other. The first III-V compound layer 10 includes gallium nitride and/or indium gallium nitride or other materials. The second III-V compound layer 12 includes aluminum gallium nitride, aluminum indium nitride, aluminum indium gallium nitride or aluminum nitride, but not limited to these materials. According to a preferred embodiment of the present invention, the first III-V compound layer 10 is gallium nitride. The second III-V compound layer 12 is aluminum gallium nitride.

A shallow recess 16, a first deep recess 18 and a second deep recess 20 are disposed in the second III-V compound layer 12. The first deep recess 18 and the second deep recess 20 are respectively disposed at two sides of the shallow recess 16. Please also refer to FIG. 2, a distance D1 between the first deep recess 18 and the shallow recess 16 is smaller than a distance D2 between the second deep recess 20 and the shallow recess 16. A source electrode 30 fills in the first deep recess 18 and contacts a top surface of the first III-V compound layer 10. A drain electrode 24 fills in the second deep recess 20 and contacts the top surface of the first III-V compound layer 10, wherein a shape of the source electrode 30 and a shape of the drain electrode 24 are different from each other. A gate electrode 34 is disposed on the shallow recess 16. A protective layer 32 covers and contacts the second III-V compound layer 12 and part of the source electrode 30, and fills in the shallow recess 16. That is, the protective layer 32 separates the gate electrode 34 and the source electrode 30, and separates the gate electrode 34 and the drain electrode 24. The protective layer 32 includes silicon nitride or aluminum nitride.

Moreover, the second III-V compound layer 12 between the shallow recess 16 and the first deep recess 18 has a first top surface 36, and the second III-V compound layer 12 between the shallow recess 16 and the second deep recess 20 has a second top surface 38. It is noteworthy that the source electrode 30 contacts the first top surface 36, and the drain electrode 24 does not contact the second top surface 38. Furthermore, the source electrode 30 includes a source body layer 22 and a source extension layer 28. The source body layer 22 fills in the first deep recess 18, contacts the top surface of the first III-V compound layer 10, and does not contact the first top surface 36 of the second III-V compound layer 12. The source extension layer 28 covers and contacts the top surface of the source body layer 22, the sidewall of the source body layer 22 and the first top surface 36 of the second III-V compound layer 12.

According to a preferred embodiment of the present invention, the material of the source body layer 22 and the source extension layer 28 are different from each other. The source extension layer 28 includes titanium nitride, gold, platinum, titanium, indium tin oxide or aluminum-doped zinc oxide, and the source body layer 22 and the drain electrode 24 respectively include titanium, aluminum, nickel, platinum or gold.

The source electrode 30 includes the source extension layer 28 covering the second III-V compound layer 12 between the gate electrode 34 and the source body layer 22. This source extension layer 28 can help decrease the on-state resistance of the HEMT 100. As shown in FIG. 7, when the HEMT 100 turns on, an equivalent resistance R1 of the source electrode 30 and the first III-V compound layer 10 is formed. An equivalent resistance R2 of the first III-V compound layer 10 toward the direction of the drain electrode 24 is formed. An equivalent resistance R3 of the source extension layer 28, the first III-V compound layer 10 and the second III-V compound layer 12 is formed. An equivalent resistance R4 of the source extension layer 28 is formed. Before the equivalent resistance R4 is added, the equivalent resistance R1, the equivalent resistance R2, and the equivalent resistance R3 electrically connect in series. After the equivalent resistance R4 is added, the equivalent resistance R1 and the equivalent resistance R2 couples in series. The equivalent resistance R3 and the equivalent resistance R4 couples in series. The equivalent resistance R1 and the equivalent resistance R2 coupling in series are electrically connected in parallel to the equivalent resistance R3 and the equivalent resistance R4 coupling in series. Therefore, the on-state resistance with equivalent resistance R4 is lower than the on-state resistance without the equivalent resistance R4. In this way, the on-state resistance of the HEMT 100 is decreased.

In addition, if the drain electrode 24 extends to the second top surface 38, the break down voltage of the HEMT 100 will decrease. Therefore, the drain electrode 24 of the HEMT 100 does not extend to the second top surface 38. Furthermore, because the HEMT 100 needs to sustain high voltage, the distance D4 between the gate electrode 34 and the drain electrode 24 is set to be larger than the distance D3 between the gate electrode 34 and the source body layer 22. In order to make the distance D4 larger than the distance D3, the distance D1 between the first deep recess 18 and the shallow recess 16 should be smaller than the distance D2 between the second deep recess 20 and the shallow recess 16.

Figure 9:
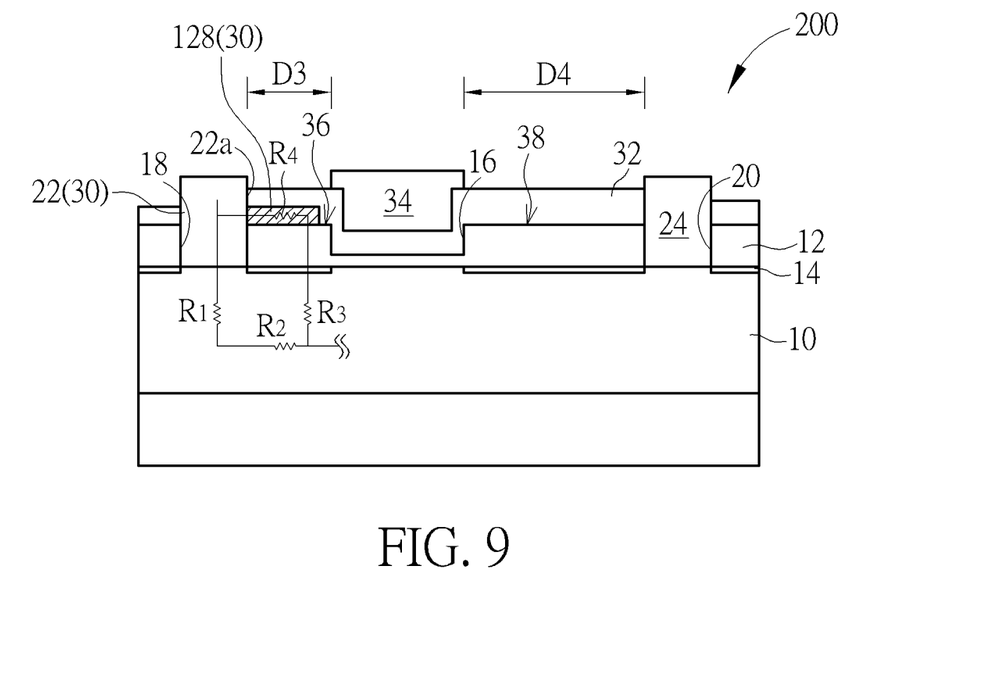
FIG. 9 depicts a modification of an HEMT.

FIG. 9 depicts an HEMT formed by a step in continuous of the step in FIG. 3 and steps described along with FIG. 8, FIG. 5 and FIG. 6, wherein elements which are substantially the same as those in the first preferred embodiment are denoted by the same reference numerals; an accompanying explanation is therefore omitted. The difference between the HEMT 200 in FIG. 9 and the HEMT 100 in FIG. 7 is that the source extension layer 128 in FIG. 9 is only disposed between the shallow recess 16 and the first deep recess 18. There is no the source extension layer 128 contacting the top surface of the source body layer 22. Furthermore, the source extension layer 128 has only an end connects to a sidewall 22a of the source body layer 22. Other part of the source extension layer 128 does not contact the source body layer 22. The source extension layer 128 is entirely sandwiched between the protective layer 32 and the second III-V compound layer 12.

Figure 10:
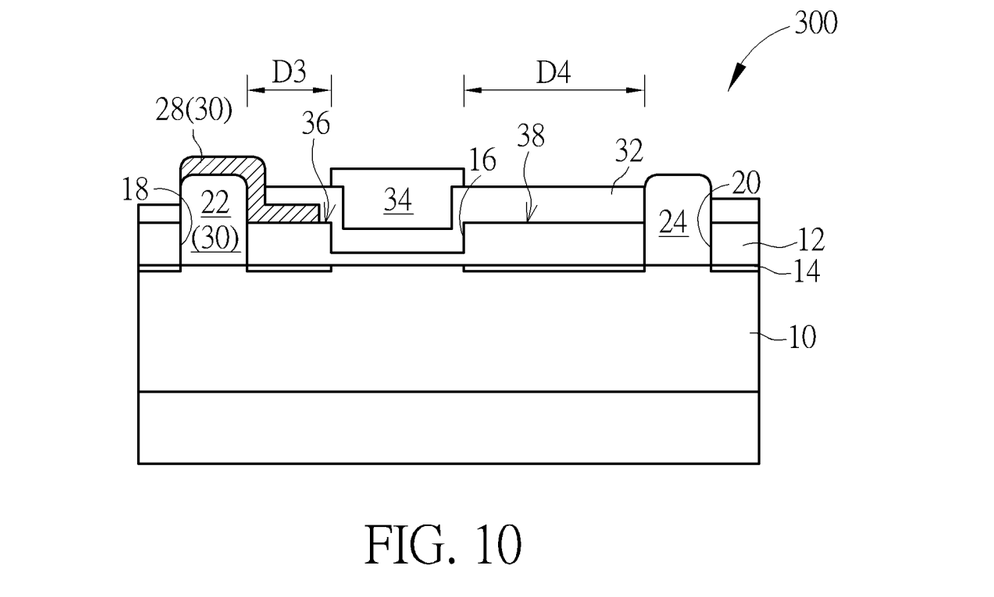
FIG. 10 depicts a modification of an HEMT.

FIG. 10 depicts a modification of an HEMT, wherein elements which are substantially the same as those in the first preferred embodiment are denoted by the same reference numerals; an accompanying explanation is therefore omitted. The difference between the HEMT 300 in FIG. 10 and the HEMT 100 in FIG. 7 is that the source body layer 22 and the drain electrode 24 are rounded by a wet etching. In detail, the corners of the source body layer 22 which do not contact the first deep recess 18 are rounded, and corners of the drain electrode 24 which do not contact the second deep recess 20 are rounded. Later, the source extension layer 28 is formed to conformally cover the source body layer 22. Because the corners of the source body layer 22 are rounded, the region on the source extension layer 28 corresponding to the rounded corner also has rounded profile.

The HEMT of the present invention has the source electrode and the drain electrode specially designed in different shapes. Furthermore, the source electrode extends toward the gate electrode, therefore, the source electrode covers the III-V compound layer between the source electrode and the gate electrode. In this way, the on-resistance of HEMT can be decreased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
   a first III-V compound layer;
   a second III-V compound layer disposed on the first III-V compound layer, wherein the composition of the first III-V compound layer and the composition of the second III-V compound layer are different from each other;

a shallow recess, a first deep recess and a second deep recess disposed in the second III-V compound layer, wherein the first deep recess and the second deep recess are respectively disposed at two sides of the shallow recess, and the second III-V compound layer between the shallow recess and the second deep recess has a second top surface;

a source electrode filling in the first deep recess and contacting a top surface of the first III-V compound layer, wherein the second III-V compound layer between the shallow recess and the first deep recess has a first top surface, and the source electrode directly contacts the first top surface, wherein the source electrode comprises:
- a source body layer, wherein the source body layer fills in the first deep recess, contacts the top surface of the first III-V compound layer, and does not contact the first top surface of the second III-V compound layer; and
- a source extension layer directly contacting the first top surface of the second III-V compound layer and only disposed between the first deep recess and the shallow recess, wherein the source extension layer only has an end connects to a sidewall of the source body layer;

a drain electrode filling in the second deep recess and contacting the top surface of the first III-V compound layer, wherein a shape of the source electrode and a shape of the drain electrode are different from each other; and a gate electrode disposed on the shallow recess.

2. The HEMT of claim 1, wherein the drain electrode does not contact the second top surface.

3. The HEMT of claim 1, wherein the source body layer and the source extension layer comprise different materials.

4. The HEMT of claim 1, wherein the source extension layer comprises titanium nitride, gold, platinum, titanium, indium tin oxide or aluminum-doped zinc oxide, and the source body layer comprises titanium, aluminum, nickel, platinum or gold.

5. The HEMT of claim 1, further comprising a protective layer covering and contacting the second III-V compound layer and part of the source electrode, and filling in the shallow recess.

6. The HEMT of claim 5, wherein the protective layer comprises silicon nitride or aluminum nitride.

7. The HEMT of claim 1, wherein the first III-V compound layer is gallium nitride, and the second III-V compound layer comprises aluminum gallium nitride, aluminum indium nitride, aluminum indium gallium nitride or aluminum nitride.

8. The HEMT of claim 1, wherein the shallow recess does not penetrate the second III-V compound layer, and the first deep recess and the second deep recess penetrate the second III-V compound layer.

9. The HEMT of claim 1, wherein a distance between the first deep recess and the shallow recess is smaller than a distance between the second deep recess and the shallow recess.

* * * * *